United States Patent [19]
Wheatley et al.

[11] Patent Number: 6,020,803
[45] Date of Patent: *Feb. 1, 2000

[54] HYBRID HIGH FIELD SUPERCONDUCTING ASSEMBLY AND FABRICATION METHOD

[75] Inventors: Roger Wheatley, Niskayona; Michael J. Hennessy, Ballston Lake, both of N.Y.

[73] Assignee: Intermagnetics General Corporation, Latham, N.Y.

[*] Notice: This patent is subject to a terminal disclaimer.

[21] Appl. No.: 08/925,409

[22] Filed: Sep. 8, 1997

Related U.S. Application Data

[62] Division of application No. 08/555,366, Nov. 8, 1995, Pat. No. 5,764,121.

[51] Int. Cl.[7] ................................................ H01F 6/00
[52] U.S. Cl. ................................. 335/216; 505/211
[58] Field of Search ........................ 335/216; 505/211, 505/212, 213, 705, 879; 174/15.4, 15.5, 125.1; 336/DIG. 1; 324/318–320

[56] References Cited

U.S. PATENT DOCUMENTS

| | | |
|---|---|---|
| 3,919,677 | 11/1975 | Young et al. . |
| 4,931,735 | 6/1990 | Overweg et al. ................... 324/318 |
| 4,974,113 | 11/1990 | Gabrielse et al. . |
| 5,138,383 | 8/1992 | Shiga et al. . |
| 5,289,150 | 2/1994 | Rabinowitz . |
| 5,310,705 | 5/1994 | Mitlitsky et al. . |

FOREIGN PATENT DOCUMENTS 363243827A 10/1988 Japan .

OTHER PUBLICATIONS

J.H.P. Watson, "High Magnetic Field Production With Ceramic Superconductors", Inst. of Cryogenics, Physics C 153–155, 1988, pp. 1401–1402.

J.H.P. Watson, "The Design For a High $T_c$ Superconducting Magnetic Separator", Supercond. Sci. Technol. 5, 1992, pp. 694–702.

J.W. Burgoyne, et al., "Flux Jump Instabilities In a Bulk $Bi_2Sr_2CaCu_sO_8+x$ Flux Tube", Cryogenics 1994, vol. 34, No. 6, pp. 507–512.

Kirschner et al.: "high–T superconducting magnets based on thick film arrangements" IEEE Transactions on Magnetics., vol. 29, No. 6, Nov. 1993, pp. 3559–3561, XP000429399 New York US *p. 3561, right–hand col., line 2–3*.

*Primary Examiner*—Renee S. Luebke
*Assistant Examiner*—Raymond Barrera
*Attorney, Agent, or Firm*—Helfgott & Karas, PC.

[57] ABSTRACT

In a high field superconducting magnet device, e.g., for NMR, a conventional low temperature superconducting solenoid type magnet is combined with an inserted superconducting magnet, which is fabricated from high temperature superconducting materials having very high critical currents. Both magnets operate with stability at the same low temperature in persistent modes after operating conditions are achieved. The flux field and superconducting currents in the inserted superconducting magnet are generated by flux trapping when the field of the low temperature superconducting solenoid type magnet is reduced. The field of the hybrid magnet assembly is the resultant of the respective fields of the two magnets.

21 Claims, 1 Drawing Sheet

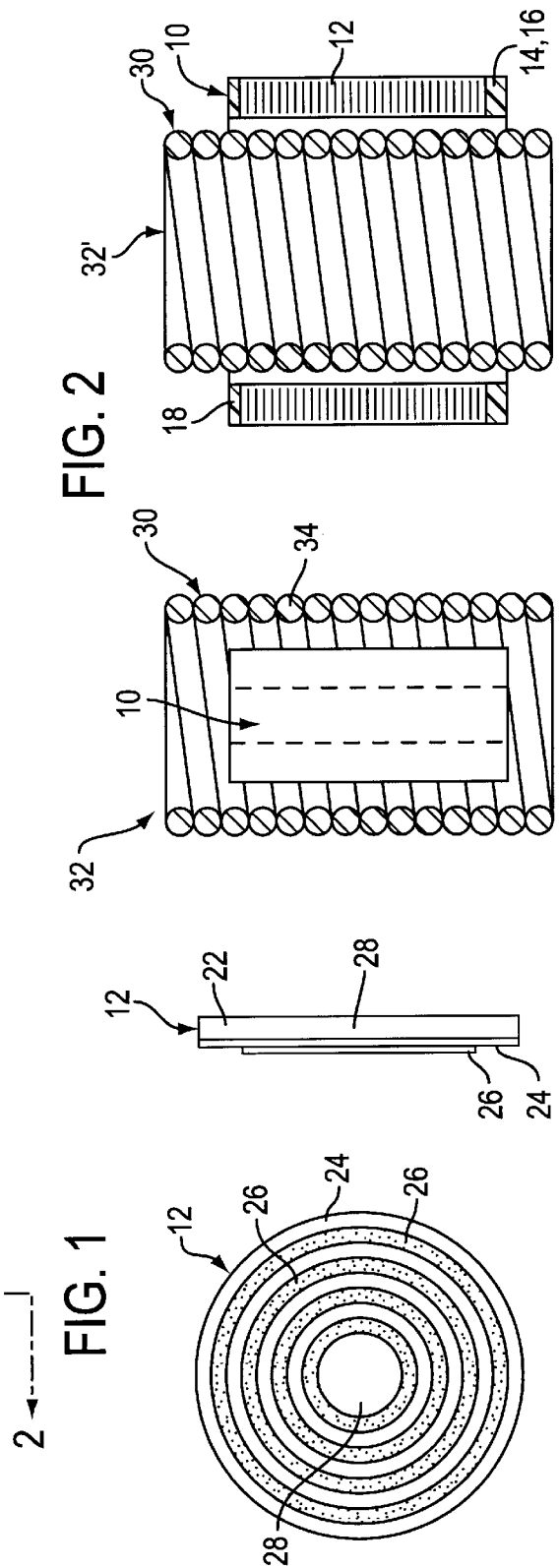

HYBRID HIGH FIELD SUPERCONDUCTING ASSEMBLY AND FABRICATION METHOD

This is a division of application Ser. No. 08/555,366, filed Nov. 8, 1995 and now U.S. Pat. No. 5,764,121.

BACKGROUND OF THE INVENTION

This invention relates generally to superconducting magnets and more particularly to high field magnets for use, e.g., in nuclear magnetic resonance (NMR) and magnetic resonance imaging (MRI) devices.

Technology in high field NMR and MRI magnets has been perfected in stages over 20 years. Starting with non-homogeneous common non-persistent magnets, the technology of NMR magnet design and construction, particularly uniformity correction, is now well understood. It is well known in NMR magnet construction that introduction of $Nb_3Sn$ material led to significant uniformity degradation because of the softness of a glass cloth insulation which was used in such magnet construction. This softness resulted in a lack of precision in placing magnet turns and a problem that necessitated a better understanding of correction of high order inhomogeneities. Having gained this knowledge, new HTS materials, with much higher critical fields, suggest avenues for their future applications in high field magnets. HTS materials offer unique high field capability at a cryogenic temperature of 4.2 K, the boiling point of liquid helium.

In U.S. Pat. No. 5,310,705 to Mitlitsky and Hoard, a high field magnet generating a field greater than 4 Tesla is fabricated from high critical temperature superconducting ceramic thin films. The high field magnet is made of stackable disk shaped substrates, which are coated with high critical temperature superconducting ceramic thin films. The films are electrically interconnected in series and are deposited on one or both sides of the disk substrates in a spiral configuration with variable line widths to increase the field.

However, 17.6 Tesla, not 4.0 Tesla, is state-of-the-art for NMR devices. These strong fields are achieved using low temperature superconducting materials such as the niobium tin composition, mentioned above, in the form of solenoids that have good stability and uniformity when operating in a persistent mode. Operation is at 4.2 K, which is achieved by boil off of liquid helium in many applications.

While a magnet for an NMR device operating at 17.6 Tesla and 4.2 K is a remarkable achievement in the art, there is the desire and/or need to produce higher field strengths, especially with magnets of the same or reduced size. It is understood that for a particular superconducting magnet, the current, and field strength are directly related. However, it is necessary in order to achieve stability in a persistent mode that the operating current in the magnet coils be substantially less than the critical current of the superconducting material. In the art, it is stated that the superconductors operate at a percentage of their "short sample" performance. Typical state-of-the-art high field NMR magnets operate at between 60%–70% of the critical current, i.e., the ratio of operating current i to critical current Ic is between 0.6 and 0.7. To raise the operating current closer to the critical current substantially increases the risk of undesirable quenching of the superconducting magnet and the risk of other instabilities in the magnetic field, as are known to those skilled in the art.

Field strength can be increased with stable performance by reducing the operating temperature of the magnet, which lower temperature permits higher values of operating current at the same time maintaining a substantial safety margin relative to the critical current. For example, the field strength of a $Nb_3Sn$ 17.6 Tesla magnet at 4 K can be increased by operating, e.g., at 2.2 K, and this lower temperature has been used in superconducting magnet systems known in the art.

However, when operating at 2.2 K, the relative simplicity of using a liquid helium boil-off refrigerating system at 4.2 K must give way to a vapor reduction system using a motorized vacuum pump, heat exchangers, throttle devices, etc. as are known in the art. On the other hand, a $Nb_3Sn$ magnet cannot maintain the increased field at 4.2 K and provide stability and assured persistence.

Superconducting magnets are needed that for a given operating temperature provide higher magnetic fields in the persistent mode than presently known magnets operating at the same temperatures. Also needed are superconducting magnets that provide the same or greater magnetic fields as presently known magnets, however, operating at a higher superconducting temperature.

SUMMARY OF THE INVENTION

In a high field superconducting magnet, e.g., for a NMR device, in accordance with the invention, a conventional low temperature superconducting solenoid type magnet is combined with an inserted superconducting magnet, which is fabricated from high temperature superconducting materials having very high critical currents. Both magnets operate with stability at the same low temperature in persistent modes after operating conditions are achieved. The field of the resultant hybrid magnet assembly, i.e., the low temperature superconducting magnet together with a superconducting insert of high temperature superconducting materials, is the resultant of the respective fields of the two magnets.

In a first mode of operation for a given operating temperature, the hybrid magnet assembly provides a higher stable magnetic field than the low temperature superconducting magnet operating alone.

In a second mode, the hybrid magnet assembly at a higher operating temperature provides the same or greater stable magnetic field strength as the low temperature superconducting magnet provided when operating alone at a lower temperature. With the insert magnet in place, the low temperature superconducting magnet is operated at the higher temperature to provide less field than in operation without the insert. The reduction in field from the low temperature magnet is compensated by the magnetic field of the insert magnet.

Both magnets operate together at the same temperature in persistent modes with good stability. A higher operating temperature, e.g., at or above 4.2 K, instead of 2.2 K, permits use of a greatly simplified refrigeration system for magnet cooling at a given flux field requirement.

The insert magnet is a stack of thin annular disks or wafers that are coated with a layer of high temperature superconducting material on one or both generally planar surfaces. The stack fits concentrically within the central opening of the coiled low temperature superconducting magnet. Each disk is an independent superconducting current loop when at a cryogenic operating temperature. There is no electrical interconnection between adjacent disks. The disks, because they are electrically independent of each other, may be stacked and placed within the low temperature superconducting magnet with perfect symmetry to the axis of the low temperature magnet. There is no helical progression or crossovers at the ends of layers as with a continuous coil. Therefore, the insert creates no distortions in the resultant magnetic field that is produced.

The magnetic field of the high temperature material superconducting insert magnet is produced by trapping a portion of the flux field from the low temperature superconducting magnet, when flux of the low temperature magnet is reduced.

In a first method, the low temperature superconducting magnet is driven at a superconducting operational temperature to produce an increased magnetic field strength, which is desired from the hybrid magnet assembly. At the same time, the insert of stacked high temperature superconducting layers is above its quenching temperature, e.g., 100 K. After the desired increased field strength is achieved from the low temperature superconducting magnet, the high temperature superconducting insert is cooled down by a refrigerating system to the superconducting temperature that is intended for continuous operation.

Then the flux of the low temperature superconducting magnet is reduced to its normal operational level by reducing its driving current. As is known, the insert traps (conserves) that flux change; flux is transferred from the low temperature superconducting magnetic field to the insert magnet and produces superconducting currents and persistent fields in the respective disks of the insert magnet. Each disk has an independent superconducting current loop.

The fields of the disks together with the field of the low temperature magnet comprise the desired resultant field of a hybrid magnet assembly. The resultant field is higher than the field of the low temperature magnet operating alone.

When the field of the low temperature superconducting magnet has been adjusted to the desired level, the low temperature superconducting magnet is placed in the persistent mode. The insert has become, in effect, a permanent superconducting magnet, and the low temperature and insert magnets both operate at the same superconducting temperature to provide an increased, persistent high intensity field with good stability and uniformity.

Because of the precise symmetry achievable using stacked, electrically isolated disks, as compared to the helical construction that results when a continuous superconducting circuit is formed from disk to disk or coil element to coil element in the prior art, the spatial uniformity of the low temperature magnet's field is easily maintained after addition of the insert magnet.

Alternatively, in a second method for trapping flux in the insert magnet, the low temperature magnet is first made operative at a superconducting temperature below its desired persistent operating temperature, while the insert is maintained in a quenched state. At this lower temperature, the low temperature magnet is driven to produce an even larger field strength, greater than it would stably produce at the intended persistent operating temperature in the first-described method. This increased field is possible without quenching the superconducting magnet since the normal operation current is set, in design of the magnet, well below the critical current density of the superconducting elements in order to assure stability and persistent operation.

Then, the insert is cooled to the intended operating temperature; the field of the low temperature magnet is reduced. As is known, flux is conserved, i.e., trapped in the insert, wherein superconducting persistent current loops are established in the respective disks. The low temperature magnet is then made persistent and allowed to warm to the operating temperature.

The result is a hybrid magnet assembly operating persistently and with stability at the intended operating temperature, but with a field strength that is increased over that produced by the low temperature magnet operating alone at the same operating temperature. The field is stronger than that produced by the first method.

Use of the high temperature superconducting materials with their exceedingly high critical current capabilities make possible an efficient adaptation of an insert magnet.

Accordingly, it is an object of the invention to provide an improved superconducting magnet assembly for use where high fields are required, e.g., in NMR and MRI devices.

Another object of the invention is to improve the field performance of a conventional low temperature superconducting magnet without change in the operating temperature of the magnet.

Still another object of the invention is to provide an improved superconducting magnet assembly by combining advantageous properties of high temperature superconducting materials with a conventional low temperature superconducting magnet.

Yet another object of the invention is to define methods for placing a high field hybrid magnet assembly into operation with persistence and stability.

Still other objects and advantages of the invention will in part be obvious and will in part be apparent in the specification.

The invention accordingly comprises the several steps and the relation of one or more of such steps with respect to each of the others, and the article possessing the features, properties and the relation of elements, which are exemplified in the following detailed disclosure, and the scope of the invention will be indicated in the claims.

BRIEF DESCRIPTION OF THE DRAWINGS

For a fuller understanding of the invention, reference is had to the following description taken in connection with accompanying drawings, in which:

FIG. 1 is an end view of a high temperature superconducting material insert in accordance with the invention;

FIG. 2 is a sectional view taken along the line 2—2 of FIG. 1;

FIG. 3 is a face view of a wafer used in the insert of FIGS. 1 and 2;

FIG. 4 is a right side view of the wafer of FIG. 3;

FIG. 5 is a schematic representation of a hybrid high field superconducting magnet assembly in accordance with the invention; and FIG. 6 is a schematic representation of an alternative embodiment of a hybrid high field superconducting magnet assembly in accordance with the invention.

DESCRIPTION OF PREFERRED EMBODIMENTS

As illustrated in FIGS. 1–5, an insert 10, in accordance with the invention, is formed by stacking a plurality of disks or wafers 12 on a tube 14 of electrically insulating non-magnetic material having a flange 16 extending from one end. A washer 18 of non-magnetic material is held on the tube 14 by a nut 20 so that a fixed stack of annular disks or wafers 12 is provided.

Each annular disk or wafer 12 comprises an electrically insulating substrate 22, a buffer layer 24 and a film or layer 26 of high temperature superconducting material. The substrate 22 has reasonable thermal conductivity and heat capacity. As illustrated in FIG. 4, the substrate 22 is coated on one surface; however, coating may alternatively be applied on both surfaces.

A stack 10 of high temperature superconducting films 26 takes advantage of the intrinsically very high critical currents of high temperature material films in the presence of a high magnetic field. High temperature superconducting films typically have critical currents $J_c$ exceeding $2 \times 10^6$ amperes per square centimeter at 77 K and exceeding $10^7$ amperes per square centimeter at 4.2 K. This film performance far exceeds the best high temperature superconducting wire demonstrated to date, with approximately $5 \times 10^4$ amperes per square centimeter.

These films may range in thickness from what is now known in the art as "thin" to "thick". Thin films, in the range of ½ micron may be epitaxially or laser deposited or sputtered, and by other techniques known for forming thin layers. Thick films that can range up to a thickness in the order of ½ millimeter, may be dipped, sintered, and melted on a prepared substrate.

A key to the technical viability of the present invention is the ability to provide a stack of high critical current, high temperature superconducting films that are sufficiently thick on substrates that are sufficiently thin such that the effective current density of the total stack is not compromised by more than about 1/10th. In other words, the stack 10 contains at least 10% high temperature superconducting high quality film 26 to provide the required magnet currents.

In the present invention, each film 26 is a complete electrical superconducting current loop which may be in the form of a single annular band of superconducting material on the buffer layer 24 or it may be many annular bands 25 (FIG. 3) on one surface. Also, the surface may be completely coated with the high temperature superconducting material whereby the superconducting current will find its own path in a superconducting current loop. Research has not reached the stage of advancement whereby optimized patterns and thickness of superconducting material on the wafer have been completely determined.

The thin insulating layer provided by the substrate 22 separates the superconducting circuit on a given disk or wafer 12 from the circuit of its adjacent neighboring disks or wafers 12. The expression "disks or wafers" has been used. The illustrated embodiment is made of circular annular layers including a central opening 28, whereby "disks" is appropriate. However, it should be understood that in alternative embodiments in accordance with the invention, the layers need not be circular and therefore "wafers" is a more generic description. For example, the insert magnet may have an oval cross sectional shape, where it is inserted in an oval cross section low temperature magnet.

Materials on the disk or wafer 12 may be any closed loop of high temperature superconductor (HTS) including thin film and thick film. Either type may be epitaxially grown, laser deposited, sputtered, sintered, dip coated or melt textured. High Jc and persistence are obtained with epitaxially grown HTS on substrates which have matched thermal expansion coefficients and where the two materials do not react with each other during the deposition process.

Examples of successful composite epitaxially grown, laser deposited and sputtered HTS with substrate are 1) $YBa_2Cu_3O_{7-}$ (YBCO) on lanthanum aluminate ($LaAlO_3$), YBCO on Sapphire $AlO_2$), and 2) $Tl2Ba_2CaCu_2O_8$ (TBCO) on $LaAlO_3$, TBCO on $AlO_2$. Examples of successful sintered, dip coated and melt textured composite HTS which do not require substrates, but instead are manufactured with silver, are the 2212 and 2223 phases of BSCCO and TBCO. A buffer layer 24 is not required with every material combination.

The insert 10 is inserted within a conventional low temperature superconducting solenoid coil 30 as illustrated in FIG. 5 to provide a hybrid superconducting magnet assembly 32 in accordance with the invention. In that figure, the superconducting conductor 34 has a round cross section. Those skilled in the art will understand that such solenoids 30 may be made, for example, from flattened superconductors and flat superconductive tapes, and may be made from single loops or plates of superconducting material that are joined together end-to-end in series to provide a continuous current circuit in the form of a helical solenoid coil.

Further, the solenoid may be formed from porous metal preforms or porous metal conductors or porous non-metal materials having conductive coatings that have the porous voids filled with low temperature superconducting material, as described in pending application Ser. No. 08/440,632, filed May 15, 1995. The present and pending applications have respective assignees that are affiliated with a common parent organization.

FIG. 5 illustrates a hybrid assembly 32 of the high temperature superconducting material insert 10 with the conventional low temperature superconducting coil. The assembly is constructed so that both elements 10, 30 operate in persistent modes with stability at a common operating temperature. As stated, stability in a persistent mode occurs when the superconductor operates at a reduced percentage of its short sample performance, i.e., substantially below the critical current density for the operating temperature and magnetic field strength in which it operates.

Thus, operation in the persistent mode is a function of the superconductor "index", which is the exponent in the expression $V=Vo(i/I_c)^n$, and is a measure of a voltage drop developed along the superconductor length, where Vo is the voltage gradient at the critical current Ic, and i is the operating current at the operating temperature. In order to obtain the arbitrarily low voltage that is necessary in a length of superconductor, such as in an NMR magnet winding, the ratio i/Ic must be appropriately low or the index n appropriately high.

State-of-the-art field NMR magnets typically operate at a i/Ic ratio of between 0.6 and 0.7 for stability. In the method in accordance with the invention, which converts the stack 10 of wafers 12 coated with high temperature superconducting material 26 into what amounts to a permanent superconducting magnet, the 0.3 to 0.4 margin in the operating current, as compared to the critical current, is utilized on the low temperature superconducting magnet so as to transfer flux from the low temperature magnet 30, and to thereby load by flux trapping the high temperature superconductor wafers 12 of the insert 10.

As explained hereinafter, the wafers 12 together serve to trap flux. Each disk or wafer 12 is a discrete superconducting current loop, which will be persistent after flux originally generated in the low temperature superconducting magnet 30 is transferred and trapped in the insert 10.

Thus, to make the hybrid assembly 32 of a low temperature superconducting coil 30 or solenoid having a high temperature material superconducting insert 10 operative, the following procedure may be followed to enhance the field strength of the low temperature superconducting magnet 30.

For the sake of an example, the method of making the hybrid magnet operative is described for a low temperature superconducting solenoid designed for persistent operation at 4.2 K, the normal boiling temperature of liquid helium at standard temperature and pressure.

Maintained at 4.2 K, the inner low temperature superconducting magnet 30 is energized above its normal operating current by a fixed percentage of that current but only so as to fall within the margin of safety that is available in its design relative to the critical current density and operating stress. At the same time, the insert 10 made with the high temperature superconducting coated wafers 12 is maintained in its own reservoir (not shown), e.g., of stainless steel or copper, at a quenched temperature, e.g., >100 K, which is maintained by appropriate electrical heaters (not shown).

After the desired (increased) field strength is achieved from the low temperature superconducting magnet 30 at 4.2 K, the high temperature superconducting insert 10 is cooled by a refrigeration system (not shown) to the temperature of 4.2 K where the high temperature superconducting material 26 is also superconducting.

The low temperature superconducting magnet 30 then has its current reduced to its normal operating current, at which current its margin will again be safely in the range of 0.3 to 0.4 relative to the critical current density. The low temperature superconducting magnet 30 is then put into the persistent mode where its loss in magnetic field will be less than one part in $10^8$ per hour.

After completion of the above method steps in activating the hybrid magnet assembly 32, the low temperature superconducting magnet 30 is operating with its normal flux density, at its normal current, at its normal operating temperature and in its normal mode, i.e., in the persistent mode. The insert 10 is now operating as a superconducting magnet. The high temperature superconducting materials 26 are operating well below their quenching temperature and are at the same temperature as the low temperature superconducting magnet 30.

The hybrid magnet assembly 32 provides a greater field strength than the field strength when the low temperature magnet 30 operates alone. Spatial uniformity of the field is maintained after the insert magnet is operative, because the insert 10 is a perfectly symmetrical arrangement of wafers that are mounted with perfect symmetry within the low temperature superconducting magnet 30.

An even greater boost in the resultant field of the hybrid magnet assembly 32 can be achieved when in the initial steps of the procedure described above, the low temperature magnet 30 is cooled below its normal operating temperature. For example, the low temperature magnet 30 can be cooled to 2.2 K instead of its normal operating temperature of 4.2 K. Then, the current may be increased by an even greater amount over the low temperature magnet's normal operating current as the "margin of safety" in the current ratio is greater at the lower temperature. The insert 10 is then cooled to its operating temperature, as described above; the low temperature superconducting magnet 30 is brought back to its normal operating current and temperature, and in the process flux is trapped by the insert 10.

This latter procedure provides a hybrid magnet assembly 32 with greater flux density than the procedure that is accomplished entirely at the intended operating temperature for the persistent mode. However, this alternative procedure is only possible with increased complexity of the refrigeration system, which is needed to operate at start-up to bring the low temperature magnet to the lower temperature, i.e., to 2.2 K, as compared to a normal operating temperature of 4.2 K in the above example.

Both of the methods described above provide an increased field strength from a hybrid magnet assembly 32 as compared to operation of the low temperature magnet 30 alone (at the same operating temperature).

In a third alternative method in accordance with the invention, the hybrid magnet assembly 32 provides the same flux output, but at a higher steady-state operating temperature, as the low temperature magnet 30 would provide at a lower temperature when operating alone.

In this method, a low temperature superconducting magnet 30 that is designed to operate at a particular low temperature, e.g., 2.2 K, so as to provide the desired field in the persistent mode, is provided with an insert 10. The insert 10 is at a quenching temperature, e.g. at 100 K, while the low temperature magnet is driven at 4.2 K to provide what would be its normal field at, e.g., 2.2 K.

The low temperature magnet 30 would operate stably by itself in the persistent mode at 2.2 K, but the risks of instability and quenching at 4.2 K are excessive; that is the low temperature magnet 30 should operate with a lower field strength if stability in the persistent mode is to be assured at 4.2 K. Thus, absent an insert 10, the advantage of a vastly simplified refrigeration system for the low temperature magnet 30 cannot be applied without a sacrifice in field strength.

However, by addition of the superconducting insert magnet 10, the decrement in magnetic field, which is produced by the low temperature magnet 30 at steady-state operating conditions, is augmented by the field of the superconducting insert magnet 10. The hybrid combination 32 can operate with persistence and stability of both magnets at the elevated temperature. Resultant field strength is maintained and a simplified refrigeration system may be achieved.

For example, a liquid helium boil-off refrigeration system may be used, which is a great advantage over the more complicated and costly vapor compression systems required for 2.2 K operation. Satisfactory field strength and spatial uniformity are effected at 4.2 K instead of 2.2 K.

Alternatively, in trapping a flux field in the insert 10, the low temperature magnet 30 is first made operative at a superconducting temperature below its desired persistent operating temperature, while the insert is maintained in a quenched state at an elevated temperature. At the lower temperature, the low temperature magnet 30 is then driven to produce a field strength greater than it would produce at the intended persistent operating temperature. This increased field is possible without quenching the superconducting magnet because the normal operating current is set in design of the magnet well below the critical current density of the superconducting elements in order to assure stability in persistent operation, and critical current values increase with lower temperature.

Then, the insert 10 is made superconductive by cooling to the intended operating temperature. When the insert 10 has been cooled, the field of the low temperature magnet 30 is reduced. As is known, the flux is conserved, trapped in the insert magnet 10 wherein superconductive persistent current loops are established in the respective disks. The low temperature magnet is then made persistent after which its temperature is allowed to rise to the operating temperature.

The result is a hybrid magnet assembly 32 operating in two persistent modes with stability at an intended operating temperature, which is higher than the normal operating temperature of the low temperature magnet 30 alone. The field strength is increased over that produced by the hybrid magnet assembly where the low temperature magnet is maintained at the same operating temperature.

Although the insert magnet 10 is positioned inside the low temperature solenoid magnet 30 in the above described embodiments, in alternative embodiments 32' (FIG. 6) in accordance with the invention, the stack 10 of wafers 12 may surround the low temperature magnet 30.

Where the wafer substrates 22 are coated on both sides with high temperature superconductor material 26, a thin layer of electrical insulation (not shown) is used to separate the wafers from each other in a stacked arrangement. It will be apparent to those skilled in the art that the substrate may be formed of an electrically conductive material, such as silver, that appears as an insulating open circuit, relative to the resistance of the superconducting loops of high temperature superconducting materials, when operating at superconducting temperatures. Such a construction may protect the wafers by shunting the superconducting current should the current loops be inadvertently quenched.

The hybrid magnet assembly 32, described above, has been constructed of a solenoid coil 30 of low temperature superconducting materials and the insert 10 has been constructed of wafers that are independent of adjacent wafers in forming independent superconducting current loops. However, it should be understood that any low temperature superconducting magnet, which can be energized and de-energized, can be used in practicing the method wherein a portion, but not all, of the flux of the low temperature superconducting magnet is transferred to the insert.

Also, the insert need not be made of wafers that are e.g., independent of each other, the insert may be wafers that are electrically connected end to end to form a series arrangement. The insert may be another coil of high temperature superconducting materials. Any high temperature superconducting material that can be maintained quenched while the low temperature magnet is brought to a superconducting condition, can be used to trap flux from the low temperature superconducting magnet when the flux of the low temperature magnet is reduced.

Mention has been made of inserts that may be either within or outside of a low temperature superconducting magnet in a concentric arrangement along a common axis. However, the method in accordance with the invention may be practiced in any physical arrangement where a reduction in flux in a low temperature superconducting magnet is able to induce currents and flux in another element providing conductive paths of high temperature superconducting material wherein superconducting persistent current may flow.

Further, in the descriptions above, the insert magnet and the low temperature superconducting magnet have been described as operating in persistent modes at the same operating temperature. However, the method in accordance with the invention may be practiced on a physical construction of a hybrid magnet assembly wherein the low temperature superconducting magnet 30 operates after flux trapping is complete at its own low temperature while at the same time the insert, fabricated of high temperature superconducting materials, operates at a much higher temperature that is nevertheless within the superconducting range for the high temperature material magnet. This multi-temperature arrangement may provide economies in construction and operation as high temperature superconducting materials are now available for superconduction near 100 K. Such materials can be cooled using, for example, boil-off of liquid nitrogen at 77 K.

Thus, the method in accordance with the invention can have wide application as new and improved materials are developed, especially those operating at higher temperatures in the superconductive mode.

Superconducting magnets now used for high resolution NMR have bores of 52 mm diameter at room temperature. For some applications, larger bores range up to approximately 90 mm diameter. An insert 10 for use with such magnets would have an outer diameter allowing positioning of the insert within the low temperature superconducting magnet.

The present state of the art for high resolution of NMR magnets is 18 Tesla and an operating temperature of 4.2 K, and 21 Tesla at 1.8 K. For an NMR grade persistent magnet, 18 Tesla is a low temperature superconductor operating limit. Using an insert in accordance with the invention, will allow the operating limit at 4.2 K to be increased to the performance level of high temperature superconductors, which is currently in excess of 25 Tesla.

In summary, the method in accordance with the invention is effective whenever the magnetic field of a driven low temperature superconducting magnet is reduced in the presence of a high temperature superconductive material device, initially having no superconducting current and no magnet field. The changing (decreasing) field of the low temperature magnet induces superconductive currents in the high temperature material device, which currents produce a magnetic field. The two existing fields combine to provide a resultant field, with the low temperature superconducting material and high temperature superconducting material operating well below their respective critical temperatures and currents in persistent modes.

For the low temperature magnet, there is a range of superconducting temperatures and flux levels that may be used as the "take-off" point for the reduction in flux. These conditions depend on the desired "end product" of flux intensity and operating temperature, and are selected based upon performance characteristics of the low temperature superconducting magnet. These selections of fluxes and temperature levels are limited by the ratios of $i/Ic$ that must be maintained at all times, before, during and after the flux trapping procedure to avoid unintended quenching of superconducting current flows in the high and low temperature superconducting materials.

It will thus be seen that the objects set forth above, among those made apparent from the preceding description, are efficiently attained and, since certain changes may be made in carrying out the above method and in the articles set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described, and all statements of the scope of the invention, which is a matter of language, might be said to fall therebetween.

What is claimed is:

1. A hybrid superconducting magnet assembly, comprising:

a magnet to produce a first magnetic flux field of a first level;

a plurality of wafers arranged in a stack, each of said wafers including a layer of a superconductive material on a surface of a substrate, said stack being positioned relative to said magnet for trapping flux from said magnet, said stack providing a second magnetic flux field of a second level after a third level of flux higher than said first level and initially generated in said magnet is reduced in intensity to said first level of said first flux field, a resultant field of said hybrid magnet assembly being a combination of said first magnetic flux field and said second magnetic flux field, each said field contributing a finite portion of said resultant field, said stack of wafers being operative in a persistent mode at a selected superconducting temperature, and means for generating and controlling said levels of flux in said magnet, and means for controlling temperature of said stack.

2. A hybrid magnet assembly as in claim 1, wherein said substrates are electrically insulating in the presence of superconductive currents in said wafers.

3. A hybrid magnet assembly as in claim 1, wherein said substrate is a material selected from a group consisting of lanthanum aluminate, sapphire and strontium titanate.

4. A hybrid magnet assembly as in claim 1, wherein said superconducting material is selected from a group consisting of YBCO, TBCO and BSCCO.

5. A hybrid magnet assembly as in claim 1, wherein at a superconducting temperature each said wafer is electrically isolated from adjacent wafers in said stack, independent superconductive current loops being formed in each said wafer when said flux is trapped.

6. A hybrid magnet assembly as in claim 5, wherein said wafers are generally planar and said superconducting material layer is applied on at least one planar surface of said wafer.

7. A hybrid magnet assembly as in claim 1, wherein each said wafer includes a buffer between said substrate and said superconducting material layer.

8. A hybrid magnet assembly as in claim 7, wherein said buffer material is strontium titanate ($SrTiO_3$) or lanthanum alumina (LaAlO).

9. A hybrid magnet assembly as in claim 1, wherein said magnet has a longitudinal axis, said stack being aligned along said longitudinal axis.

10. A hybrid magnet assembly as in claim 9, wherein said wafers are generally planar and oriented perpendicular to said longitudinal axis, said stack being aligned to said axis to preserve spatial uniformity of said first magnet flux field produced by said magnet.

11. A hybrid magnet assembly as in claim 9, wherein said magnet is a coil magnet aligned to said longitudinal axis and said stack is one of inside and outside of said coil magnet.

12. A hybrid magnet assembly as in claim 9, wherein said wafer is generally planar and said superconducting material layer is patterned on said substrate to operate as at least one superconducting closed current loop, which loop one of partially covers a planar surface of said wafer and entirely covers said planar surface of said wafer.

13. A hybrid magnet assembly as in claim 12, wherein said substrate is patterned with concentric loops of said superconducting material layer.

14. A hybrid magnet assembly as in claim 12, wherein each of said wafers has a central opening therethrough.

15. A hybrid magnet assembly as in claim 9, further comprising a tube positioned coaxially with said longitudinal axis, each said wafer having a central opening, said tube extending through said central openings of said wafers to maintain alignment of said wafers along said longitudinal axis.

16. A hybrid magnet assembly as in claim 15, wherein said tube is electrically insulating during superconductive operation of said magnet assembly.

17. A hybrid magnet assembly as in claim 15, further comprising means for releasably holding said stack of wafers in a fixed position on said tube, whereby said stack and tube are releasably integral.

18. A method for producing a hybrid magnet assembly, comprising the steps:

(a) providing a magnet for producing a first flux field of a first level (b) providing a stack of wafers each having a layer of superconducting material on a surface of a substrate;

(c) generating a flux field in said magnet that is stronger than said intended first flux field;

(d) maintaining said stack of wafers during step (c) above a quenching temperature of said superconducting material;

(e) cooling said stack of wafers to a superconductive level for said superconducting material;

(f) reducing the magnet's flux field to said first level of said first flux field, superconducting currents being induced in said wafers by trapping flux from said magnet, said stack producing a second flux field that reinforces said first flux field;

a resultant field of said hybrid magnet assembly being a combination of said first flux field and said second flux field.

19. A method as in claim 18, wherein said magnet is a coil magnet, said coil magnet having a longitudinal axis, said stack being aligned along said longitudinal axis.

20. A method as in claim 18, wherein said stack is cooled to a selected operating temperature in step (e).

21. A method as in claim 20, wherein said stack operates in a persistent mode at said selected operating temperature.

* * * * *